United States Patent
Lyu et al.

(10) Patent No.: US 6,660,822 B2
(45) Date of Patent: *Dec. 9, 2003

(54) METHOD FOR FORMING INSULATING FILM BETWEEN INTERCONNECT LAYERS IN MICROELECTRONIC DEVICES

(75) Inventors: Yi Yeol Lyu, Daejun-Shi (KR); Jin Heong Yim, Daejun-Shi (KR); Sang Kook Mah, Seoul (KR); Eun Ju Nah, Daejun-Shi (KR); Il Sun Hwang, Daejun-Shi (KR); Hyun Dam Jeong, Kyungki-Do (KR); Jin Gyu Lee, Seoul (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/895,158

(22) Filed: Jul. 2, 2001

(65) Prior Publication Data

US 2002/0098279 A1 Jul. 25, 2002

(30) Foreign Application Priority Data

Nov. 29, 2000 (KR) .......................... 2000-71645

(51) Int. Cl.⁷ .............................. C08G 77/18
(52) U.S. Cl. ........................... 528/35; 528/37; 427/387; 556/434
(58) Field of Search .................... 528/35, 37; 556/434; 427/387

(56) References Cited

U.S. PATENT DOCUMENTS

| | | |
|---|---|---|
| 3,615,272 A | 10/1971 | Collins et al. |
| 5,010,159 A | 4/1991 | Bank et al. |
| 5,378,790 A * | 1/1995 | Michalczyk et al. .......... 528/35 |
| 6,005,131 A * | 12/1999 | Jentsch et al. .............. 556/434 |

* cited by examiner

Primary Examiner—Margaret G. Moore
(74) Attorney, Agent, or Firm—Birch, Stewart, Kolasch & Birch, LLP

(57) ABSTRACT

The present invention provides a method for forming insulating film between interconnect layers in microelectronic devices, said method comprising the steps of: preparing siloxane-based resins by hydrolyzing and polycondensing the compound represented by the following formula (1), with or without the compound represented by the following formula (2), in an organic solvent in the presence of a catalyst and water; coating a silicon substrate with the siloxane-based resins dissolved in an organic solvent; and heat-curing the resulting coating film:

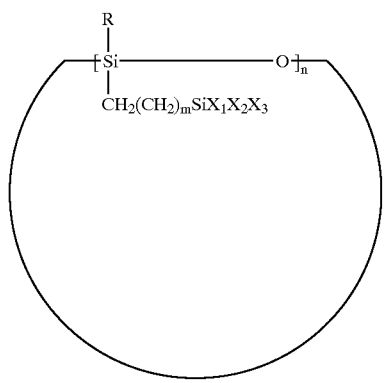

in which, R is hydrogen atom, $C_1$~$C_3$ alkyl group, $C_3$~$C_{10}$ cycloalkyl group, or $C_6$~$C_{15}$ aryl group;

$X_1$, $X_2$ and $X_3$ are independently $C_1$~$C_3$ alkyl group, $C_1$~$C_{10}$ alkoxy group, or halogen atom;

n is an integer ranging from 3 to 8; and m is an integer ranging from 1 to 10.

14 Claims, No Drawings

METHOD FOR FORMING INSULATING FILM BETWEEN INTERCONNECT LAYERS IN MICROELECTRONIC DEVICES

FIELD OF THE INVENTION

The present invention relates to a method for forming insulating film between interconnect layers in microelectronic devices. More specifically, the present invention relates to a method for forming insulating film between interconnect layers in microelectronic devices by using siloxane-based resins prepared from siloxane monomers having cyclic structure.

BACKGROUND OF THE INVENTION

Feature size in the microelectronic device has to be reduced because circuit density in multilevel integrated circuit devices is increasing. But, there are fatal problems such as R(resistance)×C(capacitance) delay due to crosstalk between interconnect lines. Therefore, dielectric constant of the interlayer insulating film should be lowered so as to decrease RC delay as much as possible. For this purpose, there have been various attempts to use materials with low dielectric constant in the insulating film. For example, hydrogensilsesquioxane having a dielectric constant of approximately 3.1 has replaced $SiO_2$ in chemical vapor deposition(CVD). The hydrogensilsesquioxane can be also applied to spin-coating due to its excellent planation property. Hydrogensilsesquioxane resins as well as preparing method thereof are well known in the art. For example, U.S. Pat. No. 3,615,272 discloses a method for preparing completely condensed soluble hydrogensilsesquioxane resins, which comprises the steps of condensing trichlorosilanes in a sulfuric acid medium, and then washing the resulting resins with D.I.-water or aqueous sulfuric acid. Further, U.S. Pat. No. 5,010,159 discloses a method for synthesizing soluble condensed hydridosilicon resins, which comprises the steps of hydrolyzing hydridosilanes in an arylsulfuric acid hydrate-containing hydrolysis medium, and then contacting the resulting resins with a neutralizing agent.

However, the previous resins have not provided sufficiently low dielectric constant required for in microelectronic devices.

SUMMARY OF THE INVENTION

A feature of the present invention is a method for forming low dielectric insulating film between interconnect layers in microelectronic devices by using siloxane-based resins prepared from siloxane monomers having cyclic structure.

Another feature of the present invention is the siloxane-based resins prepared from siloxane monomers having cyclic structure.

In accordance with one aspect of the present invention, there is provided a method for forming low dielectric insulating film between interconnect layers in microelectronic devices, said method comprising the steps of: preparing siloxane-based resins by hydrolyzing and polycondensing the compound represented by the following formula (1), with or without the compound represented by the following formula (2), in an organic solvent in the presence of a catalyst and water; coating a silicon substrate with the siloxane-based resins dissolved in an organic solvent; and heat-curing the resulting coating film:

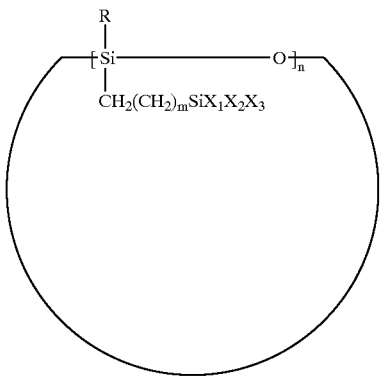
[1]

$$RSiX_1X_2X_3 \qquad [2]$$

In the above formulas (1) and (2),

R is hydrogen atom, $C_1$~$C_3$ alkyl group, $C_3$~$C_{10}$ cycloalkyl group, or $C_6$~$C_{15}$ aryl group;

$X_1$, $X_2$ and $X_3$ are independently $C_1$~$C_3$ alkyl group, $C_1$~$C_{10}$ alkoxy group, or halogen atom;

n is an integer ranging from 3 to 8; and m is an integer ranging from 1 to 10.

In accordance with another aspect of the present invention, there is provided the siloxane-based resins prepared by hydrolyzing and polycondensing the compound represented by the above formula (1), with or without the compound represented by the above formula (2), in an organic solvent in the presence of a catalyst and water.

All of the above features and other features of the present invention will be successfully achieved from the present invention described in the following.

DETAILED DESCRIPTION OF THE INVENTION

The Priority Korean Patent Application No. 2000-71645 filed on Nov. 29, 2000 is hereby incorporated in its entirety by reference.

According to the present invention, there is provided a method for forming interlayer insulating film between interconnect layers in microelectronic devices by using novel soluble cyclic siloxane-based resins having a dielectric constant less than 3.0. This method comprises the steps of: preparing siloxane-based resins by hydrolyzing and polycondensing only siloxane monomers, or both siloxane monomers and silane-based monomers in the presence of a catalyst; coating a silicon substrate with the siloxane-based resins dissolved in an organic solvent; and heating the coated substrate to cure the siloxane-based resins. The thin film thus formed has a dielectric constant less than 3.0, preferably 2.0~2.7, and therefore, it is useful for low dielectric coating film between interconnect layers in microelectronic devices.

In the present invention, the cyclic siloxane monomers can be represented by the following formula (1):

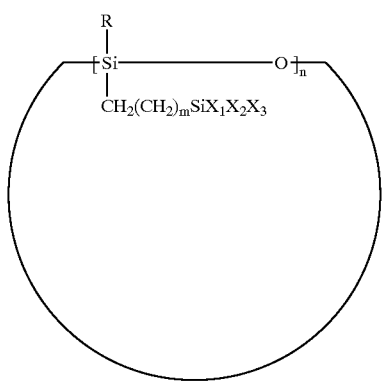

In the above formula (1),

R is hydrogen atom, $C_1$~$C_3$ alkyl group, $C_3$~$C_{10}$ cycloalkyl group, or $C_6$~$C_{15}$ aryl group;

$X_1$, $X_2$ and $X_3$ are independently $C_1$~$C_3$ alkyl group, $C_1$~$C_{10}$ alkoxy group, or halogen atom;

n is an integer ranging from 3 to 8; and m is an integer ranging from 1 to 10.

As can be seen from the above formula (1), silicon atoms are linked to each other through oxygen atoms to form cyclic structure, and the end of each branch comprises organic groups constituting a hydrolyzable substituent.

The method for preparing the cyclic siloxane monomers is not specifically limited, but hydrosililation using a metal catalyst is preferred.

The siloxane-based resins used in the present invention can be prepared by hydrolyzing and polycondensing siloxane monomers of the above formula (1), with or without silane-based monomers of the following formula (2), in the presence of an appropriate catalyst:

In the above formula (2),

R is hydrogen atom, $C_1$~$C_3$ alkyl group, $C_3$~$C_{10}$ cycloalkyl group, or $C_6$~$C_{15}$ aryl group; and $X_1$, $X_2$ and $X_3$ are independently $C_1$~$C_3$ alkyl group, $C_1$~$C_{10}$ alkoxy group, or halogen atom.

The catalyst used in the preparation of the siloxane-based resins is not specifically limited, but preferably hydrochloric acid, benzenesulfonic acid, oxalic acid, formic acid, potassium hydroxide, sodium hydroxide, triethylamine, sodium bicarbonate, or pyridine.

In the hydrolysis and polycondensation reaction, water is added at 1.0~100.0 equivalents, preferably 1.0~10.0 equivalents per one equivalent of reactive groups in the monomers, and the catalyst is added at 0.00001~10 equivalents, preferably 0.0001~5 equivalents per one equivalent of reactive groups in the monomers, and then the reaction is carried out at 0~200° C., preferably 50~110° C. for 1~100 hrs, preferably 5~48 hrs. In addition, the organic solvent used in this reaction is preferably aromatic hydrocarbon solvent, aliphatic hydrocarbon solvent, ketone-based solvent, ether-based solvent, acetate-based solvent, alcohol-based solvent, silicon-based solvent, or mixtures thereof.

The siloxane-based resins thus prepared may be dissolved in a suitable organic solvent for further use. Examples of this solvent include, but not limited to, aromatic hydrocarbons such as anisole, mesitylene and xylene; ketones such as methyl isobutyl ketone, 1-methyl-2-pyrrolidinone and acetone; ethers such as tetrahydrofuran and isopropyl ether; acetates such as ethyl acetate, butyl acetate and propylene glycol methyl ether acetate; amides such as dimethylacetamide and dimethylformamide; γ-butyrolactone; alcohols such as isopropylalcohol, butyl alcohol and octyl alcohol; silicon-based solvents; and mixtures thereof. The solvent should be used in sufficient amount to coat a substrate fully with the siloxane-based resins. Thus, the solvent is added to the siloxane-based resins so that final concentration of the solid matter can be 0.1~80 wt. %, preferably 5~30 wt. %.

Non-limiting examples of the method for coating a silicon substrate with the resinous solution containing the siloxane-based resins include spin-coating, dip-coating, spray-coating, flow-coating, screen-printing and so on. Most preferably, the coating is carried out by spin-coating. Following the coating, the solvent is evaporated from the substrate so that a resinous film containing the siloxane-based resins can deposit on the substrate. At this time, the evaporation may be carried out by simple air-drying, or by subjecting the substrate, at the beginning of curing step, to vacuum condition or mild heating ($\leq 100°$ C.).

The resulting coating film may be cured by heating for 1~150 min at a temperature of 150~600° C., more preferably 200~450° C., so as to provide insoluble film without crack. As used herein, by "film without crack" is meant a film without any crack observed with an optical microscope at a magnification of 1000X. As used herein, by "insoluble film" is meant a film which is substantially insoluble in any solvent described as being useful for the coating and deposition of the siloxane-based resins.

The present invention can be more clearly understood with referring to the following examples. It should be understood that the following examples are not intended to restrict the scope of the present invention in any manner.

EXAMPLE 1

Synthesis of Monomers

EXAMPLE 1-1

Synthesis of Monomer A

To a flask were added 29.014 mmol(10.0 g) 2,4,6,8-tetramethyl-2,4,6,8-tetravinylcyclotetrasiloxane and 0.164 g platinum(O)-1,3-divinyl-1,1,3,3-tetramethyldisiloxane complex(solution in xylene), and then diluted with 300 ml diethylether. Next, the flask was cooled to −78° C., 127.66 mmol(17.29 g) trichlorosilane was slowly added thereto, and then it was slowly warmed to room temperature. The reaction was continued at room temperature for 20 hrs, and any volatile materials were removed from the reaction mixture under reduced pressure of about 0.1 torr. To the mixture was added 100 ml pentane and stirred for 1 hr, and then the mixture was filtered through celite to provide a clear colorless solution. The pentane was evaporated from the solution under reduced pressure of about 0.1 torr to afford a colorless liquid compound, [—Si(CH$_3$)(CH$_2$CH$_2$Cl$_3$)O—]$_4$ in a yield of 95%.

11.28 mmol(10.0 g) of the compound was diluted with 500 ml tetrahydrofuran, and 136.71 mmol(13.83 g) triethylamine was added thereto. Thereafter, the mixture was cooled to −78° C., 136.71 mmol(4.38 g) methyl alcohol was slowly added thereto, and it was slowly warmed again to room temperature. The reaction was continued at room temperature for 15 hrs, filtered through celite, and then volatile materials were evaporated from the filtrate under reduced pressure of about 0.1 torr. Subsequently, 100 ml pentane was added thereto and stirred for 1 hr, and then the mixture was filtered through celite to provide a clear colorless solution. The pentane was evaporated from this solution under reduced pressure of about 0.1 torr to afford monomer A represented by the following formula (3) as a colorless liquid in a yield of 94%:

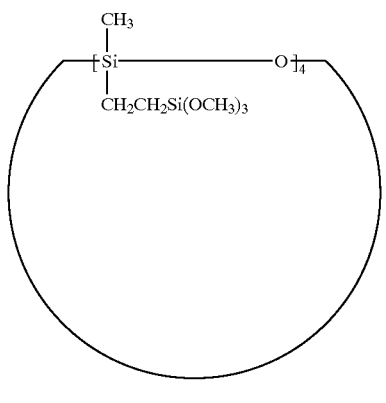

[3]

EXAMPLE 1-2
Synthesis of Monomer B

To a flask were added 8.32 mmol(2.0 g) 2,4,6,8-tetramethylcyclotetrasiloxane and 0.034 g platinum(O)-1,3-divinyl-1,1,3,3-tetramethyldisiloxane complex(solution in xylene), and then diluted with 100 ml toluene, followed by addition of 33.36 mmol(7.75 g) trimethoxy(7-octene-1-yl)silane. Next, the flask was slowly warmed to 75° C. The reaction was continued at 75° C. for 36 hrs, and then any volatile materials were removed from the reaction mixture under reduced pressure of about 0.1 torr. To the mixture was added 100 ml pentane and stirred for 1 hr, and then the mixture was filtered through celite to provide a clear colorless solution. The pentane was evaporated from this solution under reduced pressure of about 0.1 torr to afford monomer B represented by the following formula (4) as a colorless liquid in a yield of 82%:

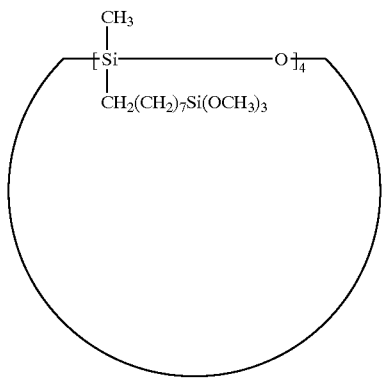

[4]

EXAMPLE 1-3
Synthesis of Monomer C

To a flask were added 6.65 mmol(2.0 g) 2,4,6,8,10-pentamethylcyclopentasiloxane and 0.03 g platinum(O)-1,3-divinyl-1,1,3,3-tetramethyldisiloxane complex(solution in xylene), and then diluted with 100 ml toluene, followed by addition of 33.32 mmol(7.74 g) trimethoxy(7-octene-1-yl)silane. Next, the flask was slowly warmed to 75° C. The reaction was continued at 75° C. for 36 hrs, and then any volatile materials were removed from the reaction mixture under reduced pressure of about 0.1 torr. To the mixture was added 100 ml pentane and stirred for 1 hr, and then the mixture was filtered through celite to provide a clear colorless solution. The pentane was evaporated from this solution under reduced pressure of about 0.1 torr to afford monomer C represented by the following formula (5) as a colorless liquid in a yield of 85%:

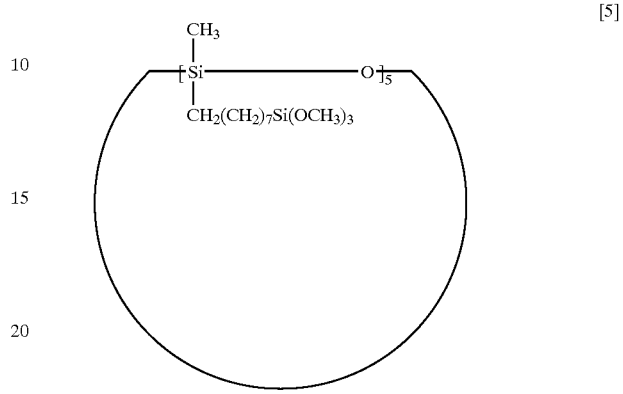

[5]

EXAMPLE 2
Synthesis of Polymers

EXAMPLE 2-1
Homopolymerization of Monomer A

To a flask was added 9.85 mmol(8.218 g) monomer A, and then diluted with 90 ml tetrahydrofuran. Next, dil. HCl solution(1.18 mmol hydrochloride) prepared by dilution of 8.8 ml conc. HCl(35 wt. % hydrochloride) with 100 ml D.I.-water was slowly added thereto at −78° C., followed by addition of more D.I.-water, so that total amount of water including the inherent water in the above added dil. HCl solution may be 393.61 mmol(7.084 g). Thereafter, the flask was slowly warmed to 70° C., and allowed to react for 16 hrs. Then, the reaction mixture was transferred to a separatory funnel, 90 ml diethylether was added thereto, and then rinsed with 5×100 ml D.I.-water. Subsequently, 5 g anhydrous sodium sulfate was added thereto and stirred at room temperature for 10 hrs to remove a trace of water, and then filtered out to provide a clear colorless solution. Any volatile materials were evaporated from this solution under lo reduced pressure of about 0.1 torr to afford 5.3 g of homopolymer A as white powder.

EXAMPLE 2-2
Homopolymerization of Monomer B

To a flask was added 9.85 mmol(11.525 g) monomer B, and then diluted with 90 ml tetrahydrofuran. Next, dil. HCl solution(1.18 mmol hydrochloride) prepared by dilution of 8.8 ml conc. HCl(35 wt. % hydrochloride) with 100 ml D.I.-water was slowly added thereto at −78° C., followed by addition of more D.I.-water, so that total amount of water including the inherent water in the above added dil. HCl solution may be 393.61 mmol(7.084 g). Thereafter, the flask was slowly warmed to 70° C., and allowed to react for 16 hrs. Then, the reaction mixture was transferred to a separatory funnel, 90 ml diethylether was added thereto, and then rinsed with 5×100 ml D.I.-water. Subsequently, 5 g anhydrous sodium sulfate was added thereto and stirred at room temperature for 10 hrs to remove a trace of water, and then filtered out to provide a clear colorless solution. Any volatile materials were evaporated from this solution under reduced pressure of about 0.1 torr to afford 6.2 g of homopolymer B as white powder.

EXAMPLE 2-3
Homopolymerization of Monomer C

To a flask was added 9.85 mmol(12.118 g) monomer C, and then diluted with 90 ml tetrahydrofuran. Next, dil. HCl solution(1.18 mmol hydrochloride) prepared by dilution of 8.8 ml conc. HCl(35 wt. % hydrochloride) with 100 ml D.I.-water was slowly added thereto at −78° C., followed by addition of more D.I.-water, so that total amount of water including the inherent water in the above added dil. HCl solution may be 393.61 mmol(7.084 g). Thereafter, the flask was slowly warmed to 70° C., and allowed to react for 16 hrs. Then, the reaction mixture was transferred to a separatory funnel, 90 ml diethylether was added thereto, and then rinsed with 5×100 ml D.I.-water. Subsequently, 5 g anhydrous sodium sulfate was added thereto and stirred at room temperature for 10 hrs to remove a trace of water, and then filtered out to provide a clear colorless solution. Any volatile materials were evaporated from this solution under reduced pressure of about 0.1 torr to afford 6.3 g of homopolymer C as white powder.

EXAMPLE 2-4
Copolymerization of Monomer A and Methyltrimethoxysilane

To a flask were added 37.86 mmol(5.158 g) methyltrimethoxysilane and 3.79 mmol(3.162 g) monomer A, and then diluted with 100 ml tetrahydrofuran. Next, dil. HCl solution(0.0159 mmol hydrochloride) prepared by dilution of 0.12 ml conc. HCl(35 wt. % hydrochloride) with 100 ml D.I.-water was slowly added thereto at −78° C., followed by addition of more D.I.-water, so that total amount of water including the inherent water in the above added dil. HCl solution may be 529.67 mmol(9.534 g). Thereafter, the flask was slowly warmed to 70° C., and allowed to react for 16 hrs. Then, the reaction mixture was transferred to a separatory funnel, 100 ml diethylether was added thereto, and then rinsed with 5×100 ml D.I.-water. Subsequently, 5 g anhydrous sodium sulfate was added thereto and stirred at room temperature for 10 hrs to remove a trace of water, and then filtered out to provide a clear colorless solution. Any volatile materials were evaporated from this solution under reduced pressure of about 0.1 torr to afford 5.5 g of copolymer A as white powder.

EXAMPLE 2-5
Copolymerization of Monomer B and Methyltrimethoxysilane

To a flask were added 37.86 mmol(5.158 g) methyltrimethoxysilane and 3.79 mmol(4.435 g) monomer B, and then diluted with 100 ml tetrahydrofuran. Next, dil. HCl solution(0.0159 mmol hydrochloride) prepared by dilution of 0.12 ml conc. HCl(35 wt. % hydrochloride) with 100 ml D.I.-water was slowly added thereto at −78° C., followed by addition of more D.I.-water, so that total amount of water including the inherent water in the above added dil. HCl solution may be 529.67 mmol(9.534 g). Thereafter, the flask was slowly warmed to 70° C., and allowed to react for 16 hrs. Then, the reaction mixture was transferred to a separatory funnel, 100 ml diethylether was added thereto, and then rinsed with 5×100 ml D.I.-water. Subsequently, 5 g anhydrous sodium sulfate was added thereto and stirred at room temperature for 10 hrs to remove a trace of water, and then filtered out to provide a clear colorless solution. Any volatile materials were evaporated from this solution under reduced pressure of about 0.1 torr to afford 5.7 g of copolymer B as white powder.

EXAMPLE 2-6
Copolymerization of Monomer C and Methyltrimethoxysilane

To a flask were added 37.86 mmol(5.158 g) methyltrimethoxysilane and 3.79 mmol(4.663 g) monomer C, and then diluted with 100 ml tetrahydrofuran. Next, dil. HCl solution(0.0159 mmol hydrochloride) prepared by dilution of 0.12 ml conc. HCl(35 wt. % hydrochloride) with 100 ml D.I.-water was slowly added thereto at −78° C., followed by addition of more D.I.-water, so that total amount of water including the inherent water in the above added dil. HCl solution may be 529.67 mmol(9.534 g). Thereafter, the flask was slowly warmed to 70° C., and allowed to react for 16 hrs. Then, the reaction mixture was transferred to a separatory funnel, 100 ml diethylether was added thereto, and then rinsed with 5×100 ml D.I.-water. Subsequently, 5 g anhydrous sodium sulfate was added thereto and stirred at room temperature for 10 hrs to remove a trace of water, and then filtered out to provide a clear colorless solution. Any volatile materials were evaporated from this solution under reduced pressure of about 0.1 torr to afford 6.1 g of copolymer C as white powder.

EXAMPLE 3
Fractionation of Polymers

EXAMPLE 3-1
Fractionation of Homopolymer A

To a flask were added 5 g of homopolymer A obtained from the above Example 2-1, and then dissolved with 7 ml acetone. The resulting solution was filtered through a syringe filter having 0.2 μM pores to remove fine particles and other contaminants therefrom. Then, the clear filtrate was recovered and 20 ml water was slowly added thereto. The resulting white powder was separated from the remaining liquid(mixture of acetone and water), and then dried at 0~5° C. under reduced pressure of about 0.1 torr to afford 3.7 g of fractionated homopolymer A.

EXAMPLE 3-2
Fractionation of Homopolymer B

The procedure of Example 3-2 was conducted according to the same manner as in the above Example 3-1, except that homopolymer B obtained from the above Example 2-2 was used instead of homopolymer A. As a result, 3.9 g of fractionated homopolymer B were obtained.

EXAMPLE 3-3
Fractionation of Homopolymer C

The procedure of Example 3-3 was conducted according to the same manner as in the above Example 3-1, except that homopolymer C obtained from the above Example 2-3 was used instead of homopolymer A. As a result, 3.8 g of fractionated homopolymer C were obtained.

EXAMPLE 3-4
Fractionation of Copolymer A

The procedure of Example 3-4 was conducted according to the same manner as in the above Example 3-1, except that copolymer A obtained from the above Example 2-4 was used instead of homopolymer A. As a result, 3.5 g of fractionated copolymer A were obtained.

EXAMPLE 3-5
Fractionation of Copolymer B

The procedure of Example 3-5 was conducted according to the same manner as in the above Example 3-1, except that copolymer B obtained from the above Example 2-5 was used instead of homopolymer A. As a result, 3.7 g of fractionated copolymer B were obtained.

EXAMPLE 3-6

Fractionation of Copolymer C

The procedure of Example 3-6 was conducted according to the same manner as in the above Example 3-1, except that copolymer C obtained from the above Example 2-6 was used instead of homopolymer A. As a result, 3.7 g of fractionated copolymer C were obtained.

EXAMPLE 4

Analysis of the Physicochemical Properties of the Polymers Including Dielectric Constant The siloxane-based resins fractionated from the above Examples 3-1 through 3-6 were analyzed, as described below, for Si—OH content, weight loss, molecular weight (hereinafter, referred to as "MW"), molecular weight distribution(hereinafter, referred to as "MWD"), film thickness, and dielectric constant. The results are set forth in the following Table 1.

TABLE 1

| Sample | Si—OH Content (%) | Weight loss (%) (200° C. → 500° C.) | MW | MWD | Film thickness (Å) | Dielectric constant (100 kHz) |
| --- | --- | --- | --- | --- | --- | --- |
| Example 3-1 | 25 | 4.1 | 3510 | 2.38 | 6780 | 2.23 |
| Example 3-2 | 23 | 4.4 | 3850 | 2.61 | 6500 | 2.14 |
| Example 3-3 | 31 | 4.8 | 4050 | 3.11 | 6600 | 2.05 |
| Example 3-4 | 22 | 3.8 | 3310 | 2.70 | 6010 | 2.00 |
| Example 3-5 | 23 | 4.1 | 3910 | 3.51 | 6050 | 2.20 |
| Example 3-6 | 27 | 4.7 | 4160 | 4.10 | 6300 | 2.10 |

[Analytical Methods]

Si—OH content(%): analyzed by NMR(Bruker Co.)
Si—OH(%)=Area(Si—OH)÷[Area(Si—OH)+Area(Si—OCH$_3$)+Area(Si—CH$_3$)]×100

Weight loss(%): analyzed by thermo gravimetric analyzer (TA instruments Co.)

MW and MWD: analyzed by gel permeation chromatography(Waters Co.)

Film thickness and Dielectric constant: The surfaces of a p-type silicon substrate with a radius of 4 inches were oxidized by heating the substrate in a Linberg furnace under dry nitrogen atmosphere. Then, a series of layers of 100 Å titanium, 2000 Å copper, and 100 Å titanium were formed on the oxidized silicon substrate by means of a CVC DC sputter. Subsequently, a resinous solution containing 20 wt. % of the siloxane-based resins of the present invention in methyl isobutyl ketone was spin-coated onto the metal layers at 2500 rpm. Next, the substrate was subjected to sequential soft baking on a hot plate for 1 min at 150° C., 1 min at 200° C., and 1 min at 350° C., so that the organic solvent might be sufficiently removed. The substrate coated as above was finally cured in a Linberg furnace at 400° C. for 30 min under nitrogen atmosphere. Then, 2000 Å aluminum electrode was sputtered onto the cured substrate, followed by spin-coating with Shipley 1827 photoresist and evaporating the organic solvent contained in the photoresist on a hot plate at 90° C. for 2 min. Thereafter, this substrate, following mounting a chrome mask having a circular pattern with a diameter of 0.1 cm thereon, was patterned by using an OAI mask aligner. Subsequently, the substrate was exposed to light to develop the pattern, treated with Shipley 354 developer for 18 sec to remove the exposed photoresist therefrom, baked on a hot plate at 120° C. for 2 min, and then etched to remove the aluminum layer. Next, the photoresist remaining on the substrate in a circle was removed with acetone to provide a final test piece for analysis of dielectric constant. Capacitance of the test piece was measured, by using a Hewlett Packard 4236 LCR Meter, at a frequency of 100 kHz across electrode dots having same diameter, and then dielectric constant thereof was calculated. Thickness of the low dielectric film was also determined by using an ellipsometer and a profiler.

EXAMPLE 5

Determination of Hardness and Elastic Modulus of the Resinous Film

EXAMPLE 5-1

Coating Film Made from Homopolymer A

The homopolymer A fractionated from the above Example 3-1 was dissolved in propylene glycol methyl ether acetate at a concentration of 25 wt. %, and the resulting resinous solution was spin-coated onto a silicon wafer at 3000 rpm for 30 seconds. Then, the coated substrate was heated under nitrogen atmosphere in a Linberg furnace for 1 min at 100° C. and 1 min at 250° C., sequentially, to remove the organic solvent. Thereafter, the temperature of the furnace was elevated step by step to 420° C. at a rate of 3° C./min, and then the substrate was cured at this temperature for 1 hr. The thickness of the coating film thus prepared was found to be 0.85 μm by the use of Gaertner model L116B ellipsometer. The hardness and elastic modulus of the coating film were quantitatively measured by using Nanoindenter II(MTS Co.) according to continuous stiffness measurement method. The substrate was indented with the indenter until the indentation depth reached 10% of the film thickness. At this time, to secure the reliability of this measurement, 6 points were indented every test piece, and the average hardness and the elastic modulus were determined from a load-displacement curve. The hardness and elastic modulus of the coating film was found to be 1.19 GPa and 7.14 GPa, respectively.

EXAMPLE 5-2

Coating Film Made from Copolymer A

According to the same manner as in the above Example 5-1, a silicon wafer was spin-coated with copolymer A fractionated from the above Example 3-4. The thickness of the coating film was found to be 0.85 μm by the use of Gaertner model L 116B ellipsometer. The hardness and the elastic modulus of the coating film were also measured as described in the above Example 5-1, and found to be 0.80 GPa and 6.08 GPa, respectively.

EXAMPLE 6

Determination of Crack-free Thickness of the Resinous Film

EXAMPLE 6-1

Coating Film Made from Homopolymer A

The homopolymer A fractionated from the above Example 3-1 was dissolved in propylene glycol methyl ether acetate with gradually increasing weight percent thereof. The resulting resinous solutions were spin-coated at various thickness onto silicon wafers at 300 rpm for 30 seconds. Then, the coated substrates were heated under nitrogen atmosphere in a Linberg furnace for 1 min at 100° C. and 1 min at 250° C. to remove the organic solvent. Thereafter, the temperature of the furnace was elevated step by step to 420° C. at a rate of 3° C./min, and then the substrates were cured at this temperature for 1 hr. The appearance of each coating film was inspected with an optical microscope to determine the thickness at which the film cracked. As a result, no crack was observed even up to 2.0 $\mu$m, indicating that the coating film is resistant to crack.

EXAMPLE 6-2

Coating Film Made from Copolymer A

According to the same manner as in the above Example 6-1, silicon wafers were spin-coated with copolymer A fractionated from the above Example 3-4. The appearance of each coating film was inspected with an optical microscope to determine the thickness at which the film cracked. As a result, no crack was observed even up to 1.5 $\mu$m, indicating that the coating film is resistant to crack.

EXAMPLE 7

Evaluation of Thermal Stability of the Resinous Film

EXAMPLE 7-1

Coating Film Made from Homopolymer A

The homopolymer A fractionated from the above Example 3-1 was dissolved in propylene glycol methyl ether acetate at a concentration of 25 wt. %. The resulting resinous solution was spin-coated onto a silicon wafer at 3000 rpm for 30 seconds. Then, the coated substrate was heated under nitrogen atmosphere in a Linberg furnace for 1 min at 100° C. and 1 min at 250° C. to remove the organic solvent. Thereafter, the temperature of the furnace was elevated step by step to 420° C. at a rate of 3° C./min, and then the substrate was cured at this temperature for 1 hr. The refractive index and the thickness of the coating film(cured once) were measured. Subsequently, the substrate was gradually warmed again to 420° C. in the furnace, and cured for another hour at this temperature, and then this curing process was repeated again. The refractive index and the thickness of the coating film(cured three-times) were measured. These measurements were substituted into the following equations to evaluate thermal stability of the coating film.

rate of thickness change(%)=[thickness of the film cured once−thickness of the film cured three-times]÷thickness of the film cured once×100     [Equation 1]

rate of refractive index change(%)=[refractive index of the film cured once−refractive index of the film cured three-times]÷refractive index of the film cured once×100     [Equation 2]

As a result, the rates of thickness and refractive index change were found to be 0.19% and 0.01%, respectively, indicating that the coating film is thermally stable.

EXAMPLE 7-2

Coating Film Made from Copolymer A

According to the same manner as in the above Example 7-1, a silicon wafer was spin-coated with copolymer A fractionated from the above Example 3-4, and cured total three-times. The rates of thickness and refractive index change were similarly calculated from the above Equations 1 and 2, and found to be 0.25% and 0.12%, respectively, indicating that the coating film is thermally stable.

EXAMPLE 8

Determination of Leakage Current and Breakdown Voltage of the Resinous Film

EXAMPLE 8-1

Coating Film Made from Homopolymer A

The homopolymer A fractionated from the above Example 3-1 was dissolved in propylene glycol methyl ether acetate at a concentration of 25 wt. %, and the resulting resinous solution was spin-coated onto a silicon wafer at 3000 rpm for 30 seconds. Then, the coated substrate was heated under nitrogen atmosphere in a Linberg furnace for 1 min at 100° C. and 1 min at 250° C. to remove the organic solvent. Thereafter, the temperature of the furnace was elevated step by step to 420° C. at a rate of 3° C./min, and then the substrate was cured at this temperature for 1 hr. The coating film thus prepared was analyzed for leakage current and breakdown voltage. In these analyses was employed a metal-insulator-Si(100)(MIS) structure. This MIS structure had an upper aluminum electrode with a diameter of 1 mm. Leakage current and breakdown voltage were determined from an I-V curve obtained by using Keithley 237 source measuring unit at room temperature. The leakage current was calculated based on the current which passed through the coating film when applying electric field of 0.5 mV/cm to the upper Al electrode and Si wafer simultaneously, and found to be $0.64 \times 10^{-10}$ A/cm$^2$. The breakdown voltage was defined as intensity of the electric field when compliance current was 10 mA, and found to be 5.4MV/cm.

EXAMPLE 8-2

Coating Film Made from Copolymer A

According to the same manner as in the above Example 8-1, a silicon wafer was spin-coated with copolymer A fractionated from the above Example 3-4, and then fabricated into a metal-insulator-Si(100)(MIS) structure having an upper aluminum electrode. The leakage current and the breakdown voltage were measured similarly to the above Example 8-1, and found to be $0.64 \times 10^{-10}$ A/cm$^2$ and 5.7MV/cm, respectively.

According to the method of the present invention, low dielectric insulating film between interconnect layers in microelectronic devices can be easily formed.

What is claimed is:

1. A method for forming insulating film between interconnect layers in microelectronic devices, said method comprising:

preparing siloxane-based resins by hydrolyzing and polycondensing the compound represented by the following formula (1), with the compound represented by the following formula (2), in an organic solvent in the presence of a catalyst and water;

coating a silicon substrate with the siloxane-based resins dissolved in an organic solvent; and heat-curing the resulting coating film:

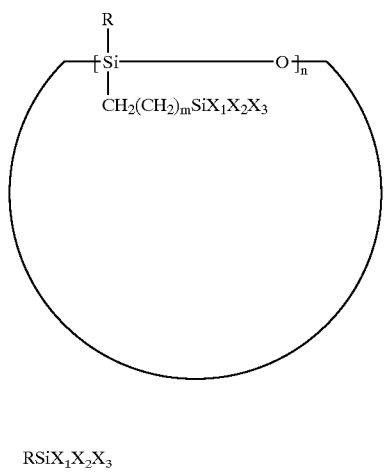

[1]

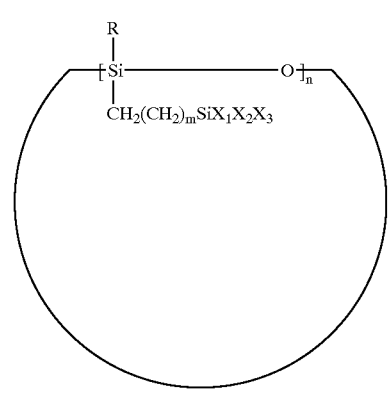

[2]

in which, R is hydrogen atom, $C_1 \sim C_3$ alkyl group, $C_3 \sim C_{10}$ cycloalkyl group, or $C_6 \sim C_{15}$ aryl group;

$X_1$, $X_2$ and $X_3$ are independently $C_1 \sim C_3$ alkyl group, $C_1 \sim C_{10}$ alkoxy group, or halogen atom;

n is an integer ranging from 3 to 8; and m is an integer ranging from 1 to 10.

2. The method according to claim 1, wherein the catalyst is hydrochloric acid, benzene sulfonic acid, oxalic acid, formic acid, potassium hydroxide, sodium hydroxide, triethylamine, sodium bicarbonate, or pyridine.

3. The method according to claim 1, wherein the hydrolysis and polycondensation is carried out at 0~200° C. for 1~100 hrs by using 1~100 equivalents of water and 0.00001~10 equivalents of catalyst per one equivalent of reactive groups in the monomers.

4. The method according to claim 1, wherein the organic solvent used in preparing the siloxane-based resins is aromatic hydrocarbon solvent, aliphatic hydrocarbon solvent, ketone-based solvent, ether-based solvent, acetate-based solvent, alcohol-based solvent, silicon-based solvent, or mixtures thereof.

5. The method according to claim 1, wherein the Si—OH content of the siloxane-based resins is more than 10%.

6. The method according to claim 1, wherein the organic solvent used in dissolving the siloxane-based resins is aromatic hydrocarbon solvent, ketone-based solvent, ether-based solvent, acetate-based solvent, amide-based solvent, γ-butyrolactone, alcohol-based solvent, silicon-based solvent, or mixtures thereof.

7. The method according to claim 6, wherein the siloxane-based resins are dissolved in the organic solvent for the concentration of the solid matter to be 0.1 to 80 wt. % of the resulting resinous solution.

8. The method according to claim 6, wherein the siloxane-based resins dissolved in the organic solvent are coated onto the silicon substrate by spin-coating at a spin rate ranging from 1000 to 5000 rpm.

9. The method according to claim 1, wherein the heat-curing is carried out at 150~600° C. for 1~150 min.

10. Siloxane-based resins having a dielectric constant less than 3.0, said resins being prepared by hydrolyzing and polycondensing the compound represented by the following formula (1), with the compound represented by the following formula (2), in an organic solvent in the presence of a catalyst and water:

in which, R is hydrogen atom, $C_1 \sim C_3$ alkyl group, $C_3 \sim C_{10}$ cycloalkyl group, or $C_6 \sim C_{15}$ aryl group;

$X_1$, $X_2$ and $X_3$ are independently $C_1 \sim C_3$ alkyl group, $C_1 \sim C_{10}$ alkoxy group, or halogen atom;

n is an integer ranging from 3 to 8; and m is an integer ranging from 1 to 10.

11. The siloxane-based resins according to claim 10, wherein the catalyst is hydrochloric acid, benzene sulfonic acid, oxalic acid, formic acid, potassium hydroxide, sodium hydroxide, triethylamine, sodium bicarbonate, or pyridine.

12. The siloxane-based resins according to claim 10, wherein the hydrolysis and polycondensation is carried out at 0~200° C. for 1~100 hrs by using 1~100 equivalents of water and 0.00001~10 equivalents of catalyst per one equivalent of reactive groups in the monomers.

13. The siloxane-based resins according to claim 10, wherein the organic solvent used in preparing the siloxane-based resins is aromatic hydrocarbon solvent, aliphatic hydrocarbon solvent, ketone-based solvent, ether-based solvent, acetate-based solvent, alcohol-based solvent, silicon-based solvent, or mixtures thereof.

14. The siloxane-based resins according to claim 10, wherein the Si—OH content of the siloxane-based resins is more than 10%.

* * * * *